(12) United States Patent
Bruccoleri et al.

(10) Patent No.: US 6,265,910 B1
(45) Date of Patent: Jul. 24, 2001

(54) WAVEFORM TRACK-AND-HOLD CIRCUIT

(75) Inventors: Melchiorre Bruccoleri, Rho; Valerio Pisati, Bosnasco, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/312,402

(22) Filed: May 14, 1999

(30) Foreign Application Priority Data

May 15, 1998 (IT) .............................................. TO98A0416

(51) Int. Cl.[7] .................................................. H03K 17/00
(52) U.S. Cl. ................................................. 327/94; 327/96
(58) Field of Search ................................. 327/91, 93, 94, 327/96; 341/122, 128, 135

(56) References Cited

U.S. PATENT DOCUMENTS

| | | | | |
|---|---|---|---|---|
| 5,272,395 | * | 12/1993 | Vincelette | 327/51 |
| 5,313,206 | * | 5/1994 | Davies et al. | 341/122 |
| 5,341,037 | * | 8/1994 | Miki et al. | 327/96 |
| 5,744,985 | * | 4/1998 | Nishida | 327/94 |
| 5,844,431 | * | 12/1998 | Chen | 327/96 |
| 6,034,556 | * | 3/2000 | Koyasu et al. | 327/96 |

* cited by examiner

Primary Examiner—Timothy P. Callahan
Assistant Examiner—An T. Luu
(74) Attorney, Agent, or Firm—Theodore E. Galanthay; Stephen Bongini; Fleit, Kain, Gibbons, Gutman & Bongini P.L.

(57) ABSTRACT

A waveform track-and-hold circuit receives an analog input signal and generates an analog output signal. The waveform track-and-hold circuit includes a differential separating input stage, a differential separating output stage, first and second charge storage means, and switch means. The first and second charge storage means are coupled between the differential separating input stage and the differential separating output stage, and the switch means are controlled by a logic control signal so as to selectively isolate the first and second charge storage means from the analog input signal. Additionally, the differential separating input stage includes a push-pull input stage connected to the switch means and receiving the analog input signal. In a preferred embodiment, the analog input signal is supplied to the emitters of transistors that form the push-pull input stage, the collectors of the transistors are connected to the switch means, and the transistors are part of current mirror circuits.

17 Claims, 3 Drawing Sheets

WAVEFORM TRACK-AND-HOLD CIRCUIT

CROSS-REFERENCE TO RELATED APPLICATIONS

This application is based upon and claims priority from prior Italian Patent Application No. TO-98-A000416, filed May 15, 1998, the entire disclosure of which is herein incorporated by reference.

BACKGROUND OF THE INVENTION

1. Field of the Invention

The present invention relates to electronic circuits, and more specifically to a waveform track-and-hold circuit that receives an analog input signal and generates an analog output signal under control of a logic control signal that identifies track operating phases and hold operating phases.

2. Description of Related Art

Waveform track-and-hold circuits, which are also known as "sample-and-hold" circuits, are most often used in association with analog-to-digital converters. Such circuits perform a sampling operation on continuous waveforms and then store the fetched value. In other words, waveform track-and-hold circuits perform input voltage tracking operations and store the corresponding value at the time instant when a control signal is applied. In general, waveform track-and-hold circuits have an analog input for the waveform to be sampled, an analog output, and a logic control input that receives a control signal (e.g., from a multiplexer). When the control signal is in a predetermined logic state (e.g., a high logic state), the waveform track-and-hold circuit behaves like a unitary gain linear amplifier or, if required, with a predetermined gain (i.e., the output waveform is a reproduction of the waveform at the analog input). The transition of the control signal from the high logic level to a low logic level enables a "hold" or storage phase.

FIG. 1 shows a conventional waveform track-and-hold circuit. The waveform track-and-hold circuit 1 includes an input buffer IB that receives the input voltage VIN (i.e., the signal to be sampled). The input buffer IB and an output buffer OB of the circuit are usually formed by emitter follower amplifiers. The output of the input buffer IB is supplied to a switch S, which is usually formed by a MOSFET transistor and controlled by a logic control signal VCK. A storage capacitor CH is then provided and followed by the output buffer OB, which supplies an output voltage VOUT (i.e., the waveform produced by the waveform track-and-hold circuit 1).

FIG. 1 also shows, in the form of an equivalent circuit, some undesired effects that are present in the conventional waveform track-and-hold circuit 1. A capacitance CS placed between the input of the logic control signal VCK and the input of the output buffer OB represents the "charge dump" effect that causes a raising of the voltage level stored during transition from the high logic signal to the low logic signal (i.e., a switch-over from the track phase to the hold phase).

A current generator IDR models the "droop rate" phenomenon, which is a reduction of the voltage value stored in the storage capacitor CH during the hold phase due to the small input current of the output buffer OB that slowly discharges the storage capacitor. A capacitor CFT represents the "feed-through" phenomenon, which is a charge injection during the hold phase that is due to the presence of parasitic capacitances in the transistor acting as the switch S. This also modifies the voltage value stored in the storage capacitor CH and directly reflects on the accuracy of a converter associated with the waveform track-and-hold circuit.

In order to overcome these drawbacks, it is known to employ differential structures such as those used in the waveform track-and-hold circuit 2 of FIG. 2. (In the following description, a differential circuit is defined as a circuit whose output signal depends on the difference of the input signals through a transfer function, such as an amplification ratio.) The waveform track-and-hold circuit 2 of FIG. 2 includes a differential input buffer DIB that receives both a positive input signal INP and a negative input signal INN. Two switches SP and SN receive the output signals OUTP' and OUTN' of the differential input buffer DIB and are followed by a first storage capacitor CI and a second storage capacitor C2, respectively. A differential output buffer DOB is provided downstream and produces two differential output signals OUTP and OUTN.

The "charge dump" effect is removed from the waveform track-and-hold circuit 2 of FIG. 2 because both switches SP and SN introduce the same charge amount (i.e., it is suppressed using differential output signals). Similarly, at least under a first approximation, the "droop rate" is equal for both differential output signals OUTP and OUTN, and so it is compensated. However, the "feed-through" issue remains, but it can be solved by connecting some capacitors between the collector of the transistor forming the differential stage of the differential input buffer DIB and the capacitor on the opposite output of the differential input stage DIB.

For example, in FIG. 2, the capacitor for the waveform track-and-hold circuit 2 is connected between the collector of the transistor whose base receives the output signal OUTP and the second storage capacitor C2. For further details, reference is made to an article by P. Vorenkamp and J. P. M. Verdaasdonk entitled "Fully Bipolar, 120-Msample/s 10-b Track-and-Hold Circuit" (IEEE Journal of Solid State Circuitry, vol. 27, No. 7, Jul. 1992), which is herein incorporated by reference.

However, conventional differential circuits of the type described above still have drawbacks. For example, they are not very flexible with respect to the type of control signal that can be sent, so it is difficult to drive the switches with CMOS signals without employing a CMOS-to-ECL signal converter. This may be a particular nuisance for hybrid circuits. Furthermore, additional capacitors are required to lower the feed-through during the hold phase. Additionally, the differential input stage is particularly sensitive to thermal drifts of the input transistors. This can lead to acquisition errors that are especially harmful if the waveform track-and-hold circuit is used for an analog-digital converter.

SUMMARY OF THE INVENTION

In view of these drawbacks, it is an object of the present invention to overcome the above-mentioned drawbacks and to provide a waveform rack-and-hold circuit that has a more efficient and improved performance.

It is another object of the present invention to provide a waveform track-and-hold circuit that has reduced feed-through during the hold phase.

Still another object of the present invention is to provide a waveform track-and-hold circuit that compensates for transistor thermal drifts.

A further object of the present invention is to provide a waveform track-and-hold circuit that with low complexity and a consequent high operating frequency.

Yet another object of the present invention is to provide a waveform track-and-hold circuit that can use an ECL logic control signal.

One embodiment of the present invention provides a waveform track-and-hold circuit that receives an analog input signal and generates an analog output signal. The waveform track-and-hold circuit includes a differential separating input stage, a differential separating output stage, first and second charge storage means, and switch means. The first and second charge storage means are coupled between the differential separating input stage and the differential separating output stage, and the switch means are controlled by a logic control signal so as to selectively isolate the first and second charge storage means from the analog input signal. Additionally, the differential separating input stage includes a push-pull input stage connected to the switch means and receiving the analog input signal. In a preferred embodiment, the analog input signal is supplied to the emitters of transistors that form the push-pull input stage, the collectors of the transistors are connected to the switch means, and the transistors are part of current mirror circuits.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
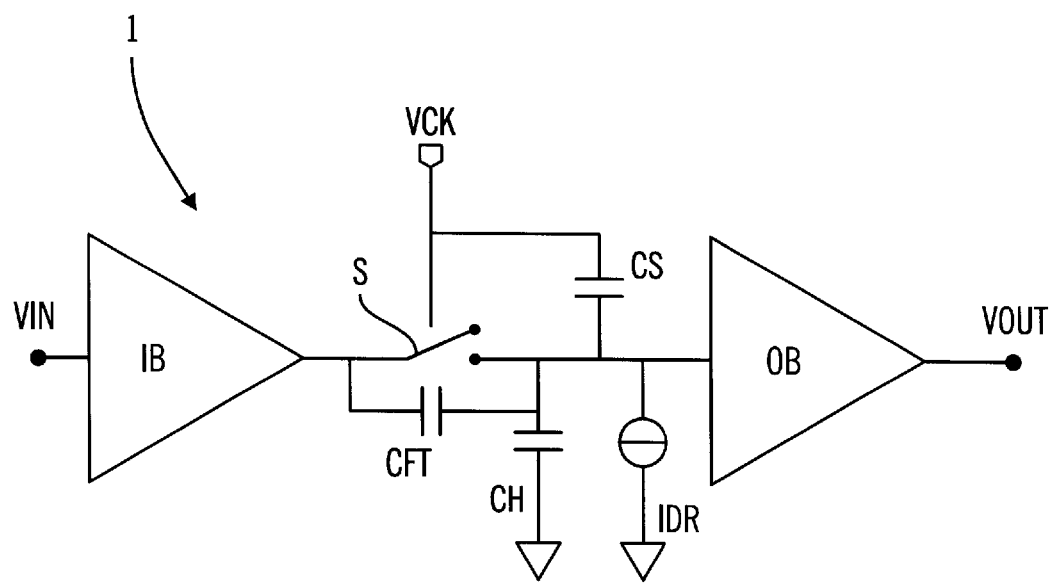
FIG. 1 shows a block diagram of a first conventional waveform track-and-hold circuit.
Figure 2:
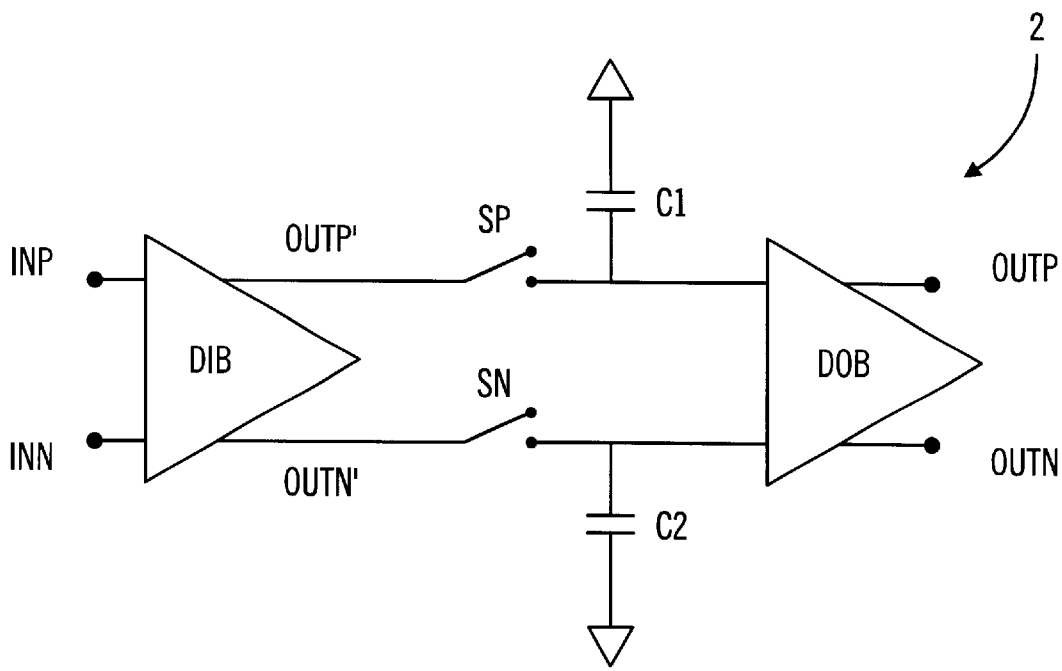
FIG. 2 shows a block diagram of a second conventional waveform track-and-hold circuit.
Figure 3:
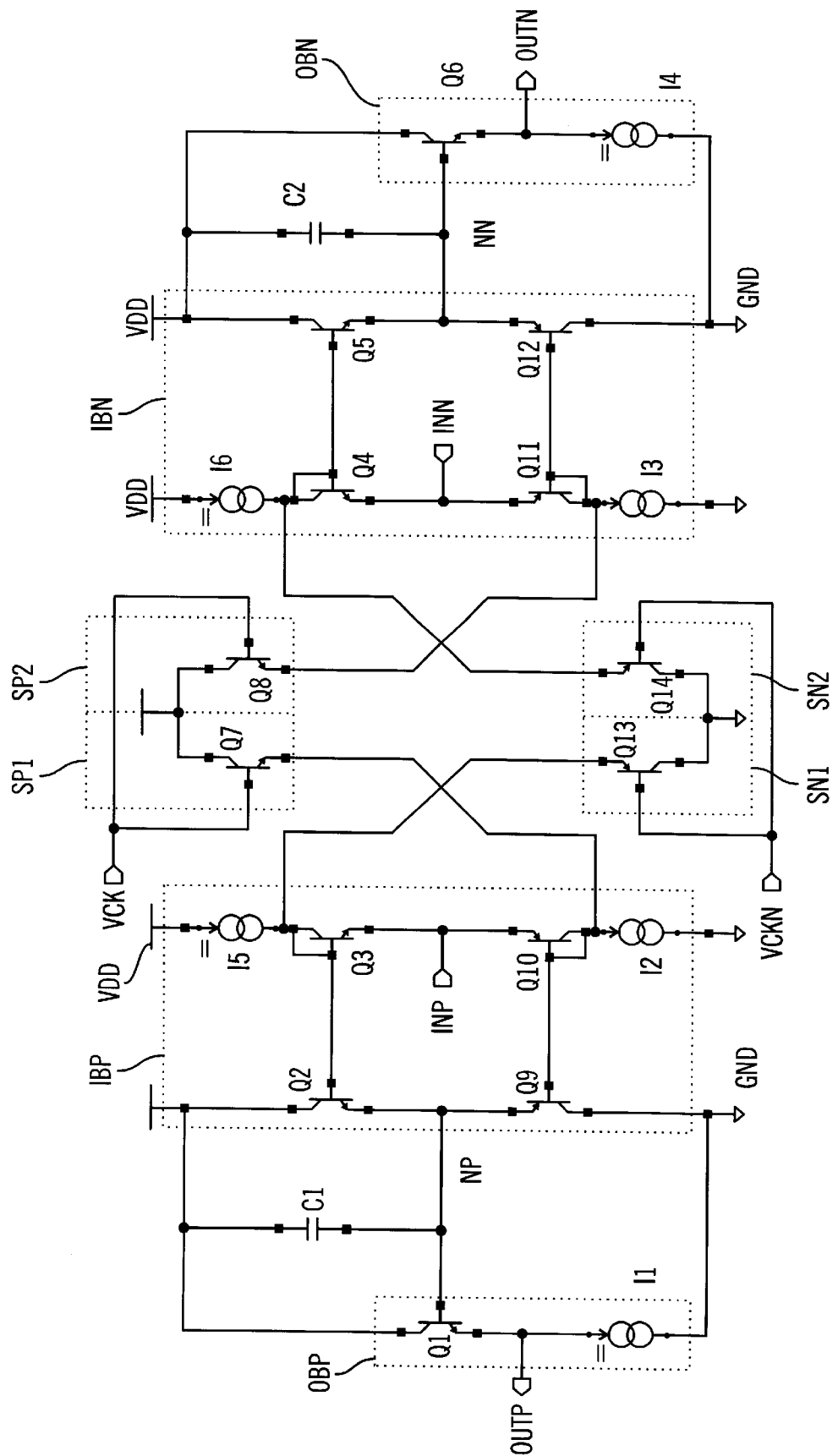
FIG. 3 shows a schematic diagram of a waveform track-and-hold circuit according to a preferred embodiment of the present invention.

FIG. 3 shows a waveform track-and-hold circuit 3 according to a preferred embodiment of the present invention. The waveform track-and-hold circuit 3 has a quasi-differential architecture, which in the illustrative embodiment of FIG. 3 is formed with bipolar transistors. (A circuit with a quasi-differential architecture is defined as a circuit that performs a differential transfer function in the input-output ratio, but without a coupling between differential branches defining a common mode node.)

The waveform track-and-hold circuit 3 provides the positive analog input signal INP reaching an input buffer circuit IBP. The input buffer circuit IBP has its own storage node NP that is connected to a first storage capacitor C1. An output buffer circuit OBP is then connected to the storage node NP and supplies a positive analog output signal OUTP. Because of the quasi-differential architecture, a push-pull structure is provided in which a negative analog input signal INN reaches an input buffer circuit IBN. The input buffer circuit IBN has its own storage node NN that is connected to it second storage capacitor C2. An output buffer circuit OBN is then connected to the storage node NN and it supplies a negative analog output signal OUTN.

A logic control signal VCK is received at the input of a first pair of switches SP1 and SP2, which control both input buffer circuit INP and input buffer circuit INN. Similarly, a complementary logic control signal VCKN is received at the input of a second pair of switches SN1 and SN2 for specular control of both input buffer circuit INP and input buffer circuit INN. The input buffer circuit IBP is formed by a class AB amplifier that consists of bipolar transistors Q3, Q10, Q2, and Q9 and current generators I5 and I2. The input buffer circuit IBP is essentially two current mirrors (one formed by transistors Q3 and Q2 and the other formed by transistors Q10 and Q9) that appear to be connected in a push-pull configuration. Transistors Q3 and Q10 operate as injection transistors in the current mirror (i.e., they receive currents imposed by current generators I5 and I2), and transistors Q3 and Q2 have their collectors short-circuited with their bases. The input signal INP is injected on the emitter of transistors Q3 and Q10.

In the track phase, the logic control signal VCK is at the low logic level so the complementary logic control signal VCKN is at the high logic level. In such a case, both the first pair of switches SP1 and SP2 and the second pair of switches SN1 and SN2 are open circuits that allow the input buffers IBN and IBP to operate according to their usual operating mode. As a result, both the positive output signal OUTP and the negative output signal OUTN track their respective input signals INP and M.

When the logic control signal VCK reaches the high logic level to cause a hold phase, transistors Q7 and Q13 (which form the first pair of switches SP1 and SP2) are brought to a diode configuration, so the current supplied by current generators I1 and I5 flows through them instead of flowing through transistors Q3 and Q10. Thus, transistors Q3 and Q10 are at cutoff (because the common mode of the input signal INP is at about half the supply voltage). Consequently, transistors Q2 and Q9 complementing the input buffer circuit IBP are also at cutoff. Therefore, the value of the positive input signal at the sampling instant is stored in the first storage capacitor C1 (i.e., when the logic control signal VCK reaches the high logic level).

During the hold phase, the positive analog input signal INP has less of an opportunity to cause a feed-through phenomenon through the parasitic capacitances of either transistor Q10 or transistor Q3. Considering transistor Q3 by way of example, during the hold phase the positive analog input signal INP finds a low impedance path as it is injected through the base-emitter capacitance of transistor Q3, which has in parallel the emitter of transistor Q13 of switch SN1. Therefore, the changes of the positive analog input signal INP cannot appreciably change the value stored in the first storage capacitor C1.

Figure 4A:
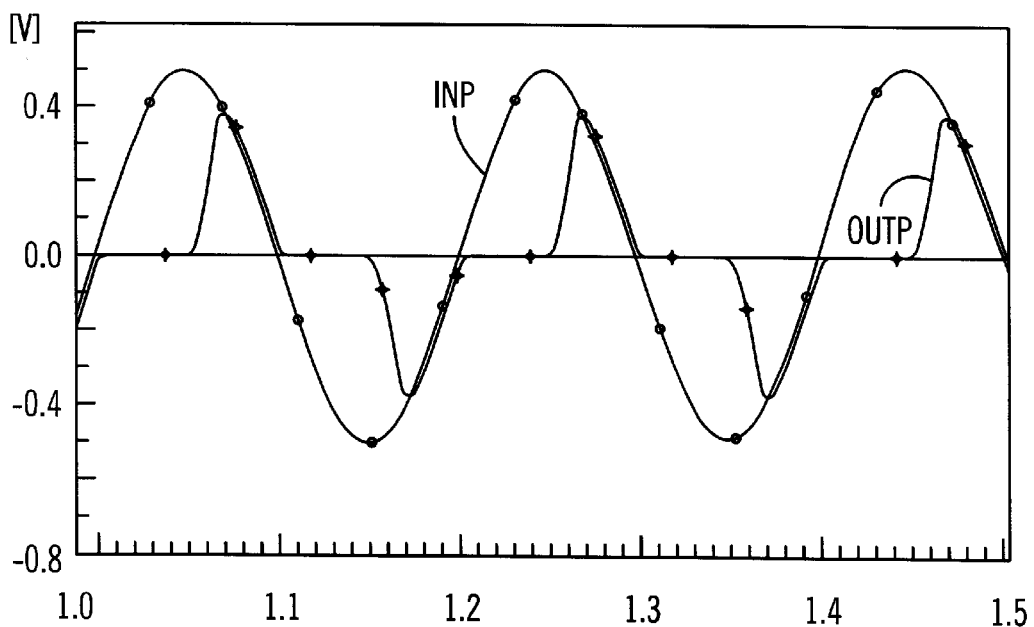
FIG. 4a shows a diagram of waveforms generated by the waveform track-and-hold circuit of FIG. 3.
Figure 4B:
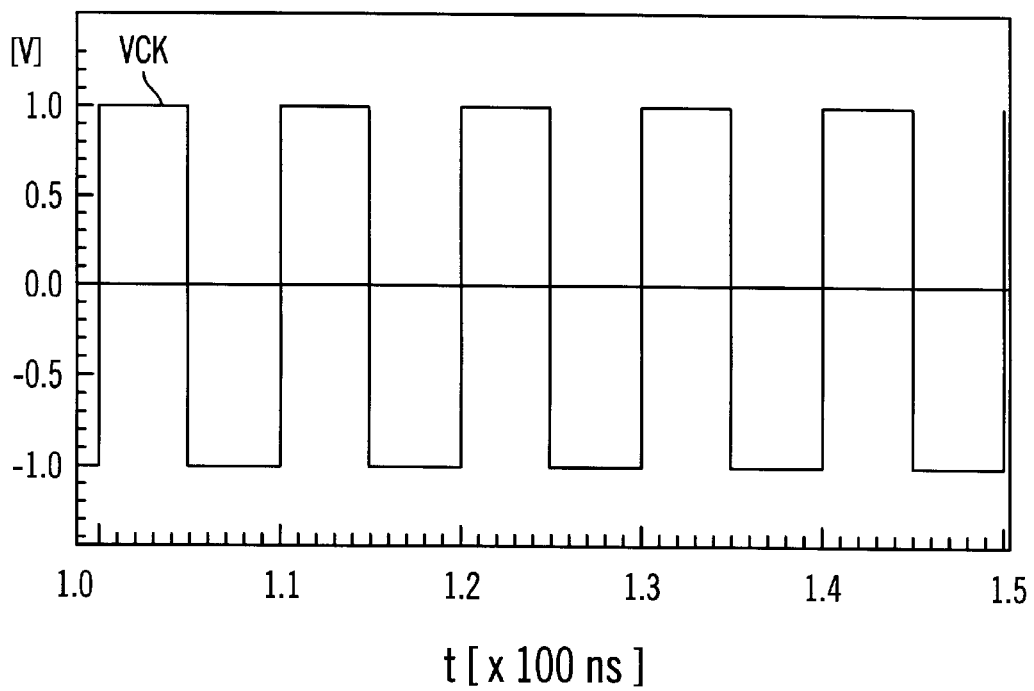
FIG. 4b shows a diagram of control signals employed by the waveform track-and-hold circuit of FIG. 3.

FIG. 4a shows the trend of the positive analog input signal INP and the representative curve of the analog output signal OUTP in line with the logic control signal VCK shown in FIG. 4b. The analog input signal INP is a sinusoidal signal with a 50 MHZ frequency that is sampled by a logic control signal VCK at a 100 Hz frequency. The logic control signal VCK is an ECL (Emitter Coupled Logic) logic signal, so the high logic level controlling the hold phase is equivalent to +1 volts and the low logic level controlling the track phase is equivalent to −1 volts. On the other hand, CMOS signals can be applied to the switches to obtain an equally efficient operation, even if transistors Q7, Q8, Q13, and Q14 are bipolar transistors.

Advantageously, the waveform track-and-hold circuit of the present invention has a low feed-through during its hold phase. In particular, during this phase, a low impedance path through the switches is obtained to hinder the input signal from changing the value stored in the capacitor. Further, the high degree of symmetry in the circuitry provides an excellent compensation for the effects caused by temperature changes. Additionally, the waveform track-and-hold circuit of the present invention can advantageously employ both ECL logic signals and logic signals pertaining to the MOS family as control signals for the switches, without having to provide any converters between logic families. The waveform track-and-hold circuit of the present invention also has a low complexity that allows a high operating frequency.

While the embodiments of the present invention described above are formed using bipolar transistors, the simple circuitry allows the waveform track-and-hold circuit of the present invention to also be easily obtained by one of ordinary skill in the art using CMOS technology. For example, a CMOS embodiment of the present invention can be obtained by simply replacing the NPN transistors with N-channel MOS transistors and the PNP transistors with P-channel MOS transistors in the disclosed embodiments.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A waveform track-and-hold circuit that receives an analog input signal and generates an analog output signal, the waveform track-and-hold circuit having a track operating phase and a hold operating phase, said waveform track-and-hold circuit comprising:

a differential separating input stage;

a differential separating output stage;

first and second charge storage means coupled between the differential separating input stage and the differential separating output stage; and switch means controlled by a logic control signal so as to selectively isolate the first and second charge storage means from the analog input signal, wherein the differential separating input stage includes a push-pull stage at the input of differential separating input stage that the push-pull stage receives the analog input signal, the push-pull stage being connected to the switch means.

2. The waveform track-and-hold circuit as defined in claim 1, wherein the analog input signal is supplied to the emitters of transistors that form the push-pull input stage, and the collectors of the transistors are connected to the switch means.

3. The waveform track-and-hold circuit as defined in claim 2, wherein the switch means form ECL logic gates configurations.

4. The waveform track-and-hold circuit as defined in claim 2, wherein the transistors that form the push-pull input stage are part of current mirror circuits.

5. The waveform track-and-hold circuit as defined in claim 1, wherein a negated control signal is generated from the control signal.

6. The waveform track-and-hold circuit as defined in claim 1, wherein the control signal controls transistors for a ground portion of the input stage, and the negated control signal controls transistors for a supply voltage portion of the input stage.

7. The waveform track-and-hold circuit as defined in claim 1, wherein the switch means provides a low impedance path during the hold operating phase.

8. The waveform track-and-hold circuit as defined in claim 1, wherein the switch means is located upstream of the first and second charge storage means.

9. A waveform track-and hold circuit that receives an analog input signal and generates an analog output signal, the waveform track-and-hold circuit having a track operating phase and a hold operating phase, said waveform track-and-hold circuit comprising:

a differential separating input stage;

a differential separating output stage;

first and second charge storage means coupled between the differential separating input stage and the differential separating output stage; and switch means controlled by a logic control signal so as to selectively isolate the first and second charge storage means from the analog input signal, wherein the differential separating input stage includes a push-pull stage the receives the analog input signal, the push-pull input stage being connected to the switch means, and the differential separating input stage has a quasi-differential architecture.

10. A waveform track-and-hold circuit that receives an analog input signal and generates an analog output signal, the waveform track-and-hold circuit having a track operating phase and a hold operating phase, said waveform track-and-hold circuit comprising:

a differential separating input stage;

a differential separating output stage;

first and second charge storage means coupled between the differential separating input stage and the differential separating output stage; and switch means controlled by a logic control signal so as to selectively isolate the first and second charge storage means from the analog input signal, wherein the differential separating input stage includes a push-pull input stage the receives the analog input signal, the push-pull input stage being connected to the switch means, and the switch means form ECL logic gates configurations.

11. An information handling system including at least one waveform track-and-hold circuit that receives an analog input signal and generates an analog output signal, the waveform track-and-hold circuit having a track operating phase and a hold operating phase, said waveform track-and-hold circuit comprising:

a differential separating input stage;

a differential separating output stage;

first and second storage elements coupled between the differential separating input stage and the differential separating output stage; and a plurality of switches controlled based on a logic control signal so as to selectively isolate the first and second storage elements from the analog input signal, wherein the differential separating input stage includes a push-pull stage at the input of the differential separating input stage such that the push-pull stage receives the analog input signal, the push-pull stage being connected to the switches.

12. The information handling system as defined in claim 11, wherein the analog input signal is supplied to the emitters of transistors that form the push-pull input stage, and the collectors of the transistors are connected to the switches.

13. The information handling system as defined in claim 12, wherein the switches form ECL logic gates configurations.

14. The information handling system as defined in claim 12, wherein the transistors that form the push-pull input stage are part of current mirror circuits.

15. The information handling system as defined in claim 11, wherein the control signal controls transistors for a ground portion of the input stage, and a complement of the control signal controls transistors for a supply voltage portion of the input stage.

16. The information handling system as defined in claim 11, wherein the switches provide a low impedance path during the hold operating phase.

17. The information handling system as defined in claim 11, wherein the differential separating input stage has a quasi-differential architecture.

* * * * *

UNITED STATES PATENT AND TRADEMARK OFFICE
CERTIFICATE OF CORRECTION

PATENT NO. : 6,265,910 B1
DATED : July 24, 2001
INVENTOR(S) : Melchiorre Bruccoleri et al.

It is certified that error appears in the above-identified patent and that said Letters Patent is hereby corrected as shown below:

<u>Title page,</u>
Item [30], under Foreign Application Priority Data, please change "TO98A0416" to -- TO98A000416 --.

Signed and Sealed this

Twenty-third Day of July, 2002

Attest:

Attesting Officer

JAMES E. ROGAN
*Director of the United States Patent and Trademark Office*